United States Patent
Zhang et al.

(10) Patent No.: US 12,461,394 B2
(45) Date of Patent: Nov. 4, 2025

(54) DISPLAY PANEL AND DISPLAY DEVICE

(71) Applicant: HEFEI VISIONOX TECHNOLOGY CO., LTD., Hefei (CN)

(72) Inventors: Jishuai Zhang, Hefei (CN); Chao Chi Peng, Hefei (CN); Wenxing Li, Hefei (CN); Mingxing Liu, Hefei (CN); Panpan Wang, Hefei (CN); Xuyang Fang, Hefei (CN); Weili Li, Hefei (CN)

(73) Assignee: HEFEI VISIONOX TECHNOLOGY CO., LTD., Hefei (CN)

( * ) Notice: Subject to any disclaimer, the term of this patent is extended or adjusted under 35 U.S.C. 154(b) by 478 days.

(21) Appl. No.: 17/994,673

(22) Filed: Nov. 28, 2022

(65) Prior Publication Data

US 2023/0088466 A1    Mar. 23, 2023

Related U.S. Application Data

(63) Continuation of application No. PCT/CN2021/105942, filed on Jul. 13, 2021.

(30) Foreign Application Priority Data

Oct. 22, 2020 (CN) .......................... 202022394064.8

(51) Int. Cl.
*G02F 1/01* (2006.01)

(52) U.S. Cl.
CPC ........ *G02F 1/0107* (2013.01); *G02F 2203/01* (2013.01)

(58) Field of Classification Search
CPC ..................................................... G02F 1/0107
See application file for complete search history.

(56) References Cited

U.S. PATENT DOCUMENTS

| | | | |
|---|---|---|---|
| 10,727,438 B2 | 7/2020 | Li et al. | |
| 2011/0122628 A1* | 5/2011 | Han | H10K 50/854 |
| | | | 362/267 |
| 2021/0305534 A1* | 9/2021 | Moon | H10K 59/8791 |

FOREIGN PATENT DOCUMENTS

| | | |
|---|---|---|
| CN | 208045551 U | 11/2018 |
| CN | 210129515 U | 3/2020 |

(Continued)

OTHER PUBLICATIONS

Office Action for Korean Patent Application No. 10-2023-7004243; dated Feb. 17, 2025; 11 pages.

(Continued)

*Primary Examiner* — Joseph P Martinez
(74) *Attorney, Agent, or Firm* — Quarles & Brady LLP

(57) ABSTRACT

A display panel comprising a display region, a non-display region around the display region, and a transition display region located between the display region and the non-display region, wherein the display panel comprises: a display base plate; an encapsulation cover plate located on the display base plate and configured to seal the display base plate; a support column disposed between the display base plate and the encapsulation cover plate, and configured to support the encapsulation cover plate. In the transition display region, a surface of the encapsulation cover plate close to the display base plate is provided with a first groove, and/or a surface of the display base plate close to the encapsulation cover plate is provided with a second groove.

24 Claims, 7 Drawing Sheets

(56) References Cited

FOREIGN PATENT DOCUMENTS

| CN | 111047970 A | 4/2020 |
| CN | 107221554 B | 6/2020 |
| CN | 111312096 A | 6/2020 |
| CN | 111370457 A | 7/2020 |
| EP | 0785446 A2 | 7/1997 |
| KR | 1020110058503 A | 6/2011 |
| KR | 1020190070424 A | 6/2019 |

OTHER PUBLICATIONS

International Search Report (International Application No. PCT/CN2021/105942) with English Translation, dated Sep. 1, 2021, 8 pages.
Written Opinion (International Application No. PCT/CN2021/105942) with English Translation, dated Sep. 1, 2021, 6 pages.

* cited by examiner

DISPLAY PANEL AND DISPLAY DEVICE

CROSS-REFERENCE TO RELATED APPLICATIONS

This application is a continuation of international patent application PCT/CN2021/105942, filed on Jul. 13, 2021, entitled "DISPLAY PANEL AND DISPLAY DEVICE", which claims priority to Chinese Patent Application No. 202022394064.8, filed on Oct. 22, 2020, entitled "DISPLAY PANEL AND DISPLAY DEVICE", the contents of the above identified applications are hereby incorporated by reference in their entireties.

TECHNICAL FIELD

The present disclosure relates to the field of display technology, and in particular, to a display panel and a display device.

BACKGROUND

With the rapid development of electronic devices, users' requirements for screen-to-body ratio are getting higher and higher, making full-screen display of electronic devices attract more and more attention in the industry.

SUMMARY

The present disclosure provides a display panel and a display device, which are convenient for the under-screen integration of photosensitive assemblies, increase the screen ratio, and ensure the overall strength of the display panel.

In one aspect, the present disclosure provides a display panel, the display panel has a display region, a non-display region around the display region, and a transition display region located between the display region and the non-display region. The display panel includes: a display base plate; an encapsulation cover plate, located on the display base plate and configured to seal the display base plate; a support column, disposed between the display base plate and the encapsulation cover plate, and configured to support the encapsulation cover plate. In the transition display region, a surface of the encapsulation cover plate close to the display base plate is provided with a first groove, and/or a surface of the display base plate close to the encapsulation cover plate is provided with a second groove.

On another aspect, the present disclosure also provides a display device including the aforementioned display panel and a photosensitive assembly. The photosensitive assembly is disposed corresponding to the light-transmitting region of the display panel. The display panel includes a first surface and a second surface opposite the first surface. The first surface is a display surface, and the photosensitive assembly is located on a side of the display panel where the second surface is located.

In the display panel and display device according to the present disclosure, the display panel has a display region, a non-display region around the display region, and a transition display region located between the display region and the non-display region. The non-display region may be integrated with a driving circuit, a Flexible Printed Circuit (FPC) and other elements. The display panel includes a display base plate; an encapsulation cover plate located on the display base plate and configured to seal the display base plate; a support column disposed between the display base plate and the encapsulation cover plate, and configured to support the encapsulation cover plate. The support column improves the strength and the pressure resistance of the display region of the display panel, which prevents display defects, such as water ripples, Newton's ring, and the like, from appearing on the display panel. In addition, in the transition display region, the surface of the encapsulation cover plate close to the display base plate is provided with the first groove, and/or the surface of the display base plate close to the encapsulation cover plate is provided with a second groove. In order to prevent the Newton's ring from being generated when the support strength of the support column in the display region is lower than the support strength of the edge encapsulation structure such as the Frit encapsulation structure, the surface of the encapsulation cover plate close to the display base plate in the transition display region is provided with the first groove with preset depth, and/or the surface of the display base plate close to the encapsulation cover plate in the transition display region is provided with the second groove with preset depth. Since the ordinary light source has the wave train length of several micrometers, the groove provided in the encapsulation cover plate or the display base plate can destroy the mutual interference condition of lights at both ends of the bathtub curve, thereby fundamentally avoiding the Newton's ring phenomenon.

The display panel further has a light-transmitting region located in the display region, such that the photosensitive assemblies can be integrated on the back of the light-transmitting display region in the display panel, so as to realize the under-screen integration of the photosensitive assemblies such as cameras, and the like. In the light-transmitting region, the surface of the encapsulation cover plate close to the display base plate is provided with a third groove, and/or the surface of the display base plate close to the encapsulation cover plate is provided with a fourth groove, which destroys the condition of mutual interference of lights on the basis of ensuring the light transmittance of the light-transmitting region, and fundamentally avoids the Newton's ring phenomenon.

DETAILED DESCRIPTION

Figure 1:
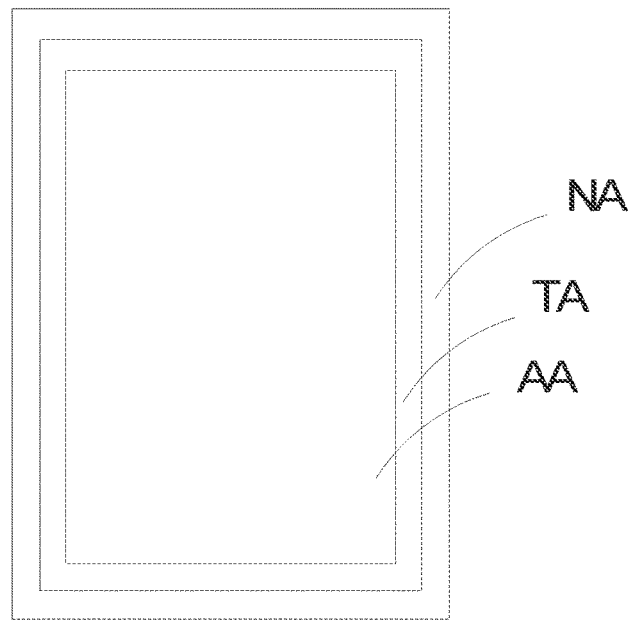
FIG. 1 is a top view of a display panel provided by the present disclosure.

Conventional electronic devices such as mobile phones, tablet computers, etc., are commonly integrated with front cameras, earpieces and infrared sensing elements, etc. In general, by providing a notch or a hole in the display screen, external light can enter the photosensitive element located under the screen through the notch or the hole in the screen. However, an improvement of light transmittance of the electronic devices may lead to a deterioration of intensity of the display panel, which affects the quality of the display panel.

The features and exemplary embodiments of various aspects of the present disclosure will be described in detail below. In order to make the purpose, technical solutions and advantages of the present disclosure clearer, the present disclosure will be further described in detail below with reference to the accompanying drawings and specific embodiments. It should be understood that the specific embodiments described herein are only configured to explain the present disclosure, and are not configured to limit the present disclosure.

Features and exemplary embodiments of various aspects of the present disclosure are described in detail below. Furthermore, the features, structures or characteristics described below may be combined in any suitable manner in one or more embodiments.

In the process of development and design of the display panel, on the one hand, the inventor found that if a hard-screen display panel includes two parts: a base plate and a cover plate, a sealing between the base plate and the cover plate is realized by the Frit encapsulation structure around an edge of the panel. At the same time, a support column (also can be called Spacer, SPC) with a certain height and density is arranged between the sub-pixels on the base plate of the display region of the display panel to support the cover plate and prevent the cover plate from crushing the sub-pixels. However, under a combined action of different factors such as gravity, atmospheric pressure, frit encapsulation structure and the supporting force of the support column, the cover plate deforms following a "bathtub curve". In the range of a few millimeters from the edge of the screen, due to the sharp deformation of the cover plate, there is an optical path difference in the propagation of light in the wedge-shaped microcavity in this range, which causes the lights reflected by the lower surface of the cover plate and by the upper surface of the base plate to be interfered with each other, resulting in the Newton's ring problem.

On the other hand, in electronic devices such as mobile phones, tablet computers, and etc., it is necessary to integrate photosensitive assemblies, such as front cameras, infrared light sensors, proximity light sensors, and etc., on a side of the display panel. In some embodiments, a light-transmitting region may be provided on the aforementioned electronic device, and the photosensitive assembly may be arranged on a back surface of the light-transmitting region, so as to realize the full-screen display of the electronic device under a condition of ensuring a normal operation of the photosensitive assembly.

The light-transmitting region integrated with photosensitive assembly is capable of displaying static or dynamic images, that is, the light-transmitting region in this case is the light-transmitting display region; the light-transmitting region may also be a non-display region, that is, the light-transmitting region in this case may be a blind hole. A film layer structure of the display panel corresponding to the blind hole retains part of a light-transmitting film layer. In general, the display panel is provided with the support column to improve the overall strength of the display panel, but the arrangement of the support column may affect the light transmittance of the light-transmitting region of the display panel. In order to increase the light transmittance of the light-transmitting region, the arrangement of the support column is reduced, such as reducing the area of the support columns or reducing the number of the support columns. However, reducing the arrangement of the support columns will reduce the support strength of the light-transmitting region, which easily causes the cover plate to be greatly deformed at the light-transmitting region, such that there is a certain optical path difference when different light beams are reflected on the cover plate, which easily leads to display defects such as Newton's ring on the display panel, and affects the display effect of the display panel.

In order to solve the above problems, the present disclosure provides a display panel and a display device. The display panel and the display device of the present disclosure will be described in detail below with reference to the accompanying drawings.

Figure 6:
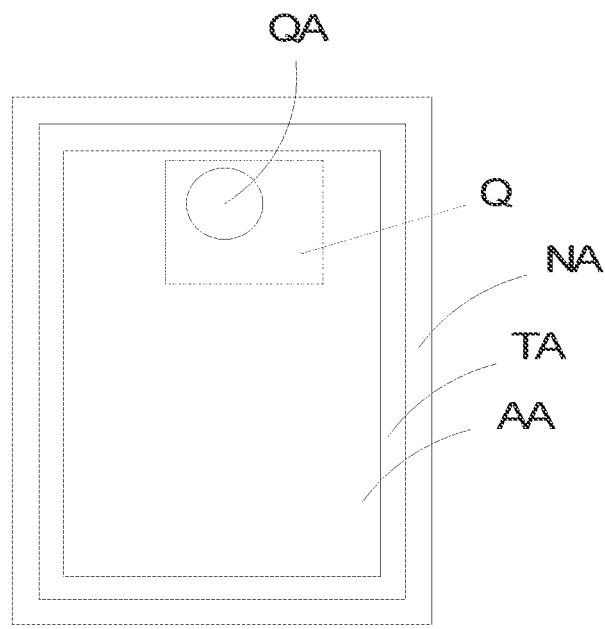
FIG. 6 is a top view of the display panel with a light-transmitting region QA according to the present disclosure.

Referring to FIG. 1 and FIG. 6 together, the present disclosure provides a display panel having a display region AA, a non-display region NA around the display region AA, and a transition display region TA located between the display region AA and the non-display region NA. The non-display region NA is arranged around the display region AA, which is convenient to arrange driving elements, such as a driving circuit, a flexible circuit board, and etc., in the non-display region NA. Of course, the non-display region NA may also be provided with other structures, such as a Frit encapsulation structure, which is not limited here. The display panel also includes a light-transmitting region QA located in the display region AA. Due to arranging the light-transmitting region QA capable of transmitting light, the photosensitive assembly is allowed to be arranged on the back of the light-transmitting region QA. When the light-transmitting region QA is the display region, the full-screen display of the electronic device can be realized under the condition of ensuring the normal operation of the photosensitive assembly. Compared with arranging the photosensitive assembly in the non-display region NA, the display panel provided by the present disclosure can effectively increase the screen-to-body ratio to facilitate full display. In the present disclosure, the light-transmitting region QA may be a display region for displaying static or dynamic images, and a pixel circuit for driving the light-transmitting region QA may be arranged in the display region AA adjacent to the light-transmitting region QA. The light transmittance of the light-transmitting region QA may be greater than or equal to 15%. In order to ensure that the light transmittance of the light-transmitting region QA is greater than 15%, or even greater than 40%, or even to ensure a higher light transmittance, the light transmittances of at least part of functional film layers of the display panel in the present disclosure are greater than 80%, or even greater than 90%. In other embodiments, the light-transmitting region QA may also be a blind hole structure.

Figure 2:
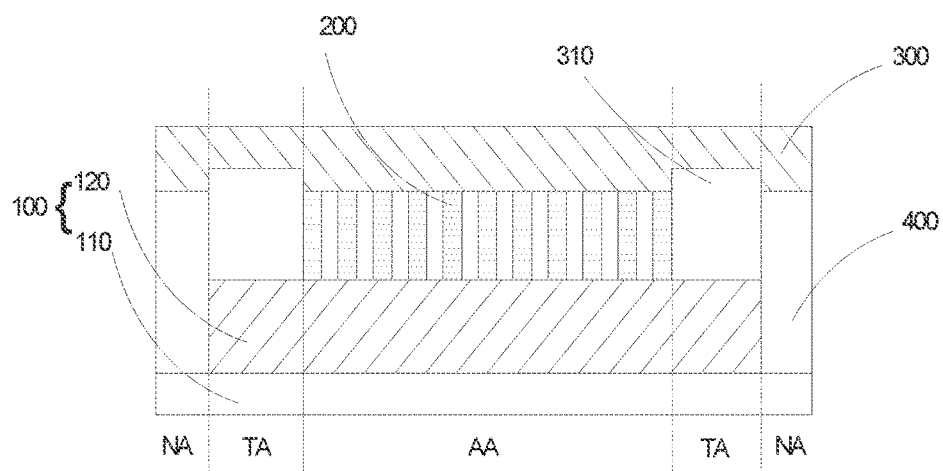
FIG. 2 is a schematic cross-sectional view of an embodiment of the display panel shown in FIG. 1.
Figure 3:
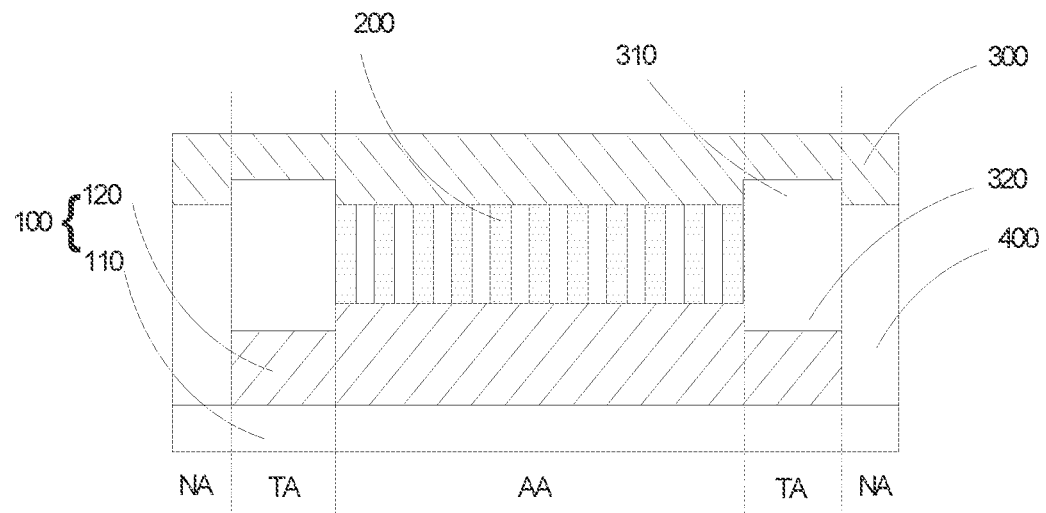
FIG. 3 is a schematic cross-sectional view of another embodiment of the display panel shown in FIG. 1.

Combining with FIGS. 2 to 3, the display panel includes a display base plate 100; an encapsulation cover plate 300 located on the display base plate 100 and configured to seal the display base plate 100; a support column 200 disposed between the display base plate 100 and the encapsulation cover plate 300 and configured to support the encapsulation cover plate 300. The display base plate 100 includes a substrate 110 and an array device layer 120 disposed on the substrate 110. The array device layer 120 may include sub-pixels and pixel circuits configured to drive the sub-pixels to emit light, and the types of pixel circuits may include 1T, 2T1C, or 7T1C, and the like. The display panel further includes an encapsulation structure 400 disposed between the substrate 110 and the encapsulation cover plate 300, a side of the support column 200 facing away from the substrate 110 and a side of the encapsulation structure 400 facing away from the substrate 110 are flush in a thickness direction of the display panel, which is capable of effectively prevent Newton's rings from being generated due to the non-uniform heights of the support columns 200 and the encapsulation structure 400.

In the transition display region TA, at least one of the display base plates 100 and the encapsulation cover plate 300 is provided with a groove, and the arrangement of the grooves includes the following three arrangements. (1) As shown in FIG. 2, in the transition display region TA, a surface of the encapsulation cover plate 300 close to the display base plate 100 is provided with a first groove 310; (2) In the transition display region TA, a surface of the display base plate 100 close to the encapsulation cover plate 300 is provided with a second groove 320, this arrangement is not shown in the figures; (3) As shown in FIG. 3, in the transition display region TA, the surface of the encapsulation cover plate 300 close to the display base plate 100 is provided with the first groove 310, and the a surface of the display base plate 100 close to the encapsulation cover plate 300 is provided with the second groove 320.

A depth of the first groove 310 is greater than or equal to 10 μm and less than or equal to 100 μm, or a depth of the second groove 320 is greater than or equal to 10 μm and less than or equal to 100 μm. Since an ordinary light source has a wave train length of several micrometers, a first groove 310 formed on a contact surface of the encapsulation cover plate 300 and the support column 200 in the transition display region TA, and having a depth greater than or equal to 10 micrometers, is capable of destroying the interference condition of light and avoid the Newton's ring phenomenon. Preferably, the depth of the first groove 310 may be 20 μm, 40 μm, 50 μm or 70 μm, etc. As long as the depth of the first groove 310 is reasonably designed, so that the interference condition of light can be destroyed, the Newton's ring phenomenon can be avoided, and the strength of the encapsulation cover plate 300 can be guaranteed. The second groove 320 is disposed on a contact surface of the display base plate 100 and the support column 200 in the transition display region TA, and the depth of the second groove 320 is greater than or equal to 10 μm, which is capable of destroying the interference condition of light and avoid the Newton's ring phenomenon. Preferably, the depth of the second groove 320 may be 20 μm, 40 μm, 50 μm or 70 μm. As shown in FIG. 3, the display panel may include a first groove 310 disposed on the surface of the encapsulation cover plate 300 close to the display base plate 100; and a second groove 320 disposed on the surface of the display base plate 100 close to the encapsulation cover plate 300. The orthographic projections of the first groove 310 and the second groove 320 on the display base plate 100 are coincident, and the sum of the depths of the first groove 310 and the second groove 320 may be greater than or equal to 10 μm and less than or equal to 100 μm. The aforementioned arrangement can reduce the depth of the grooves in the encapsulation cover plate 300 and the display base plate 100, thereby avoiding the influence on the strength of the encapsulation cover plate 300 and the display base plate 100.

In the display panel of the present disclosure, by providing the first groove 310 in the encapsulation cover plate 300 located in the transition display region TA, and/or providing the second groove 320 in the display base plate 100 located in the transition display region TA, and by reasonably setting the width of the transition display region TA, the depth of the first groove 310 in the encapsulation cover plate 300 and the depth of the second groove 320 in the display base plate 100, the phenomenon of mutual interference of reflected lights in the transition region from the display area AA to the non-display area NA can be prevented, thereby avoiding the Newton's ring problem. Compared with providing the support column 200 in the transition display region TA, the display panel of the present disclosure can fundamentally avoid the Newton's ring phenomenon for the following reasons. That is, the ordinary light source has the wave train length of several micrometers, and thus the mutual interference condition of lights can be destroyed by providing a groove of with a predetermined depth in the contact surface of the encapsulation cover plate 300 and the support column 200, so that it is prevent Newton's rings from being generated when the supporting strength of the support column 200 in the display region is less than the supporting strength of the edge encapsulation structure, such as Frit encapsulation structure.

The display panel may further include a third groove 330 provided in the encapsulation cover plate 300, or a fourth groove 340 provided in the display base plate 100, or the third groove 330 provided in the encapsulation cover plate 300 and the fourth groove 340 provided in the display base plate 100, which is provided according to the actual structure of the display panel.

Figure 7:
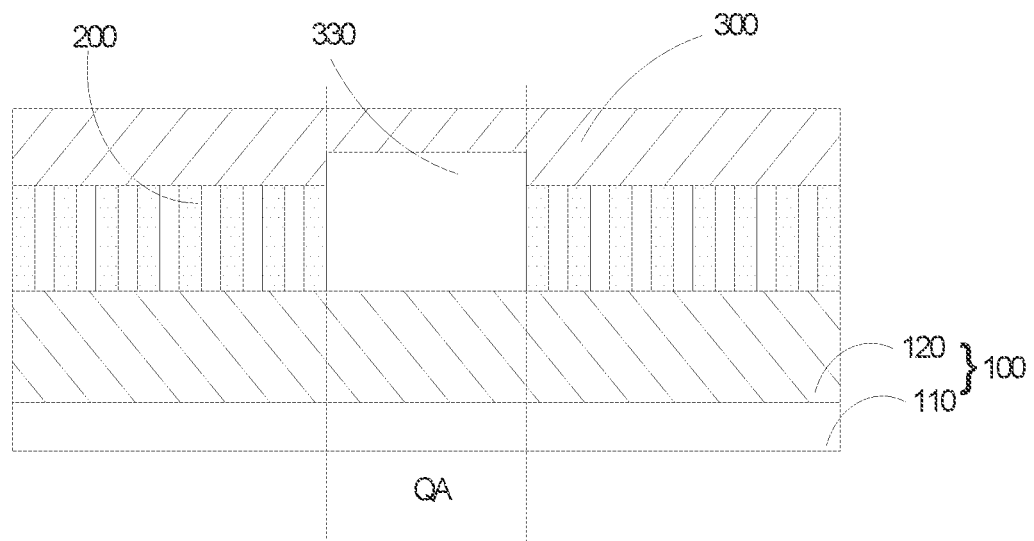
FIG. 7 is a schematic cross-sectional view of an embodiment of the display panel shown in FIG. 6.
Figure 8:
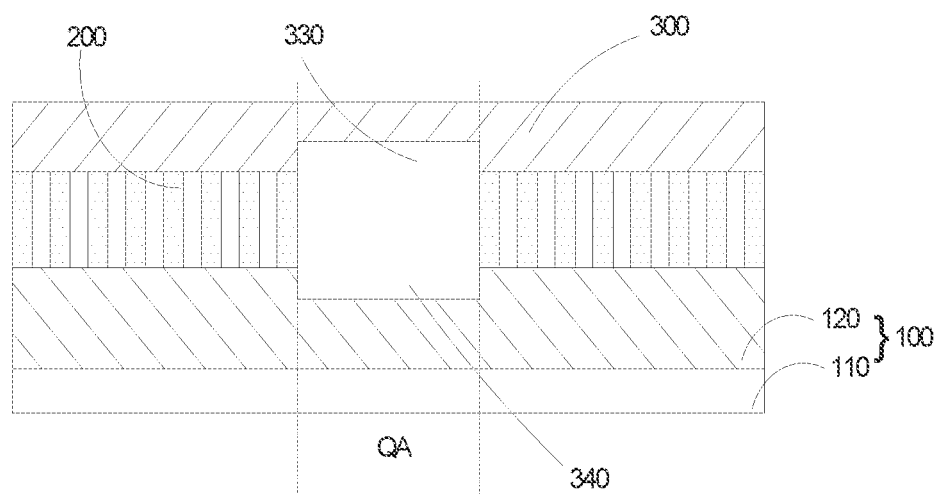
FIG. 8 is a schematic cross-sectional view of another embodiment of the display panel shown in FIG. 6.

Referring to FIGS. 7 and 8, in the light-transmitting region QA, arrangements of the third groove 330 and the fourth groove 340 include the following three arrangements. That is, (1) As shown in FIG. 7, in the light-transmitting region QA, the surface of the encapsulation cover plate 300 close to the display base plate 100 is provided with the third groove 330; (2) In the light-transmitting region QA, the surface of the display base plate 100 close to the encapsulation cover plate 300 is provided with the fourth groove 340, and this arrangement is not shown in figures; (3) As shown in FIG. 8, in the light-transmitting region QA, the surface of the encapsulation cover plate 300 close to the display base plate 100 is provided with the third groove 330, and the surface of the display base plate 100 close to the encapsulation cover plate 300a is provided with the fourth groove 340.

Through the aforementioned arrangement, by providing the third groove 330 in the encapsulation cover plate 300 in the light-transmitting region QA, and/or providing the fourth groove 340 on the display base plate 100 in the light-transmitting region QA, the phenomenon of mutual interference of reflected lights can be prevented, thereby fundamentally avoiding the Newton's ring problem. In addition, it is also avoided providing the support column 200 in the light transmission region QA, which reduces the influence of the support column 200 on the light transmittance of the light-transmitting region QA, and effectively improves the light transmittance of the light-transmitting region QA. By providing the third groove 330 and/or the fourth groove 340, the mutual interference condition of light can be destroyed, and the Newton's ring phenomenon can be fundamentally avoided.

The depth of the third groove 330 is greater than or equal to 10 μm and less than or equal to 100 μm, or the depth of the fourth groove 340 is greater than or equal to 10 μm and less than or equal to 100 μm. Preferably, the depth of the third groove 330 or the fourth groove 340 may be 20 μm, 40 μm, 50 μm or 70 μm, etc. As long as the depths of the third groove 330 and the fourth groove 340 are reasonably designed, so that the interference condition of light can be destroyed, the Newton's ring phenomenon can be avoided, and the strength of the encapsulation cover plate 300 can be guaranteed. Preferably, the depths of the first groove 310 and the third groove 330 may be the same, and the depths of the second groove 320 and the fourth groove 340 may be the same, and the first groove 310, the third groove 330, the second groove 320 and the fourth groove 340 can be fabricated simultaneously, which simplifies the fabrication process of the display panel.

By providing the first groove 310 and/or the second groove 320 in the transition display region TA, and providing the third groove 330 and/or the fourth groove 340 in the light-transmitting region QA, on the one hand, the grooves destroy the mutual interference condition of lights, which fundamentally avoids the Newton's ring phenomenon for the following reasons. That is, the ordinary light source has the wave train length of several micrometers, the third groove 330 is formed on the contact surface of the encapsulation cover plate 300 and the support column 200 in the light-transmitting region QA, and the first groove 310 is formed on the contact surface of 200 the encapsulation cover plate 300 and the support column 200 in the transition display region TA, and the depth of the grooves is reasonably designed, for example, the grooves are formed to be 10 μm or more, the interference condition of light is destroyed, and the Newton's ring phenomenon is avoided. Moreover, the actual simulation data shows that the thickness of the encapsulation cover plate 300 of the display panel is generally in a range from 200 μm to 300 μm. For example, in the case where the thickness of the encapsulation cover plate 300 is 250 μm and the area of the light-transmitting region QA is generally 3.5 square millimeters, if a groove with a depth of 10 μm is formed on the encapsulation cover plate 300, the strength of the encapsulation cover plate 300 is reduced by 0.7%, and if a groove with a depth of 15 μm is formed on the encapsulation cover plate 300, the strength of the encapsulation cover plate 300 is reduced by 5.2%. Therefore, the influence of providing the groove in the encapsulation cover plate 300 on the strength of the encapsulation cover plate 300 is negligible.

Figure 4:
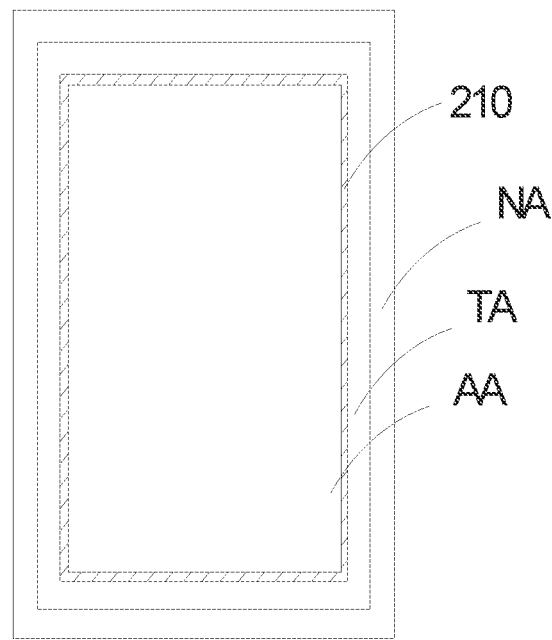
FIG. 4 is a top view of an embodiment of the display panel with the first annular support column according to the present disclosure.
Figure 5:
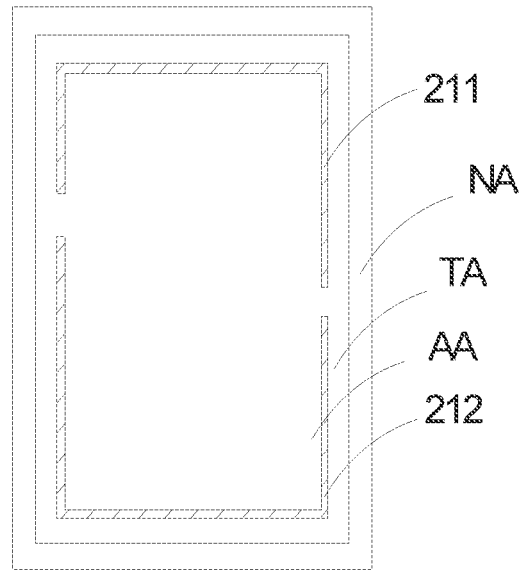
FIG. 5 is a top view of another embodiment of the display panel with the first annular support column according to the present disclosure.

Referring to FIG. 4 and FIG. 5, in the display panel provided by the present disclosure, the support column 200 of the display panel includes a first annular support column 210, which 210 is located in the display region AA close to the transition display region TA, and is arranged around the transition display region TA. When the first annular support column 210 is pressed down by the encapsulation cover plate 300, the first annular support column 210 improves the support strength of the support column 200, thereby reducing the deformation amount of the encapsulation cover plate 300 in the transition display region TA. Arrangements of the first annular support column 210 include the following two arrangements.

(1) The first annular support column 210 is an annular support column arranged concentrically with the center of the transition display region TA. In this case, the orthographic projection of the first annular support column 210 on the display base plate 100 is a ring concentric with the transition display region TA. The term "ring" refers to a closed structure with an inner edge and an outer edge in a broad sense, which may be any one of a circular ring, a square ring or a polygonal ring. The inner edge and the outer edge of the orthographic projection of the first annular support column 210 on the display base plate 100 may be concentrically arranged to define a ring.

(2) The first annular support column 210 includes at least two arc-shaped sub-support columns, and the at least two arc-shaped sub-support columns are spaced apart from each other. The first annular support column 210 includes a first arc-shaped sub-support column 211 and a second arc-shaped sub-support column 212. The first arc-shaped sub-support column 211 and the second arc-shaped sub-support column 212 are located in the display region AA and arranged around the transition display region TA. Through the aforementioned arrangement, the first annular support column 210 is provided with two continuous arc-shaped sub-support columns without affecting the aperture ratio of the sub-pixels in the display region AA, so as to improve the strength of the display panel.

Figure 10:
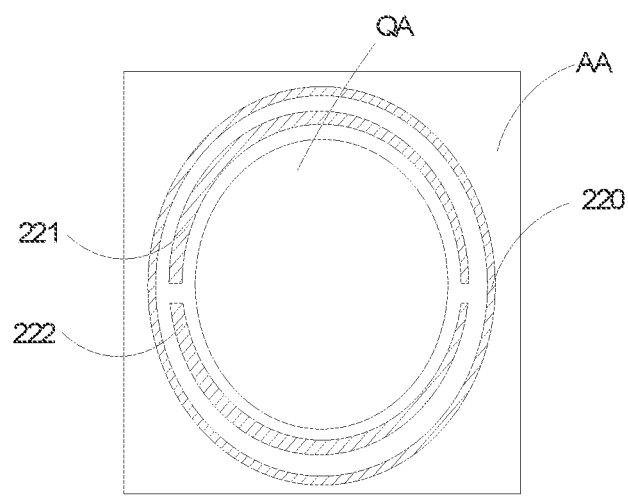
FIG. 10 is an enlarged schematic view of the display panel shown in FIG. 6 at position Q.

As shown in FIG. 10, the support column 200 further includes a second annular support column 220. The second annular support column 220 is located in the display region AA close to the light-transmitting region QA, and is arranged around the light-transmitting region QA. When the second annular support column 220 in the present disclosure is pressed down by the encapsulation cover plate 300, the deformation amount of the encapsulation cover plate 300 in the light-transmitting region QA can be effectively reduced.

The second annular support column 220 includes at least two arc-shaped sub-support columns, and the at least two arc-shaped sub-support columns are spaced apart from each other. Specifically, as shown in FIG. 10, FIG. 10 is an enlarged schematic view of a display panel at position Q shown in FIG. 6. The second annular support column 220 includes a third arc-shaped sub-support column 221 and a fourth arc-shaped sub-support column 222. The third arc-shaped sub-support column 221 and the fourth arc-shaped sub-support column 222 are located on other display regions AA adjacent to the light-transmitting region QA, and are arranged around the light-transmitting region QA. Through the aforementioned arrangement, the second annular support column 220 is provided with two continuous arc-shaped sub-support columns without affecting the aperture ratio of the sub-pixels in the display region AA, so as to improve the strength of the display panel.

In the present disclosure, the support column 200 is provided in the display region AA, and avoids the transition display region TA and the light-transmitting region QA, that is, the transition display region TA and the light-transmitting region QA are not provided with the support column 200, and the interference conditions of light are broken by providing grooves, so that the generation of Newton's ring is fundamentally avoided, and the influence of the support column 200 on the light transmittance of the light-transmitting region QA can be avoided.

The support column 200 supports the encapsulation cover plate 300 to improve the strength of the display panel, and to prevent the encapsulation cover plate 300 from being deformed, or to prevent the display panel from being deformed when subjected to external stress. The constituent material of the support column 200 includes, but is not limited to, photosensitive siloxane (PSPDO) and/or photosensitive polyimide photoresist (PSPI). At least part of the support column 200 is doped with at least one of a rigid bar and a rigid particle. The material of the rigid bar includes at least one of silicon, titanium, steel, and fiber-reinforced composite material. The material of the rigid particle includes at least one of silicon, titanium, steel, and fiber-reinforced composite material. Through the aforementioned arrangement, the rigidity of the support column 200 is improved, and the deformation or breakage of the support column 200 is prevented.

Figure 9:
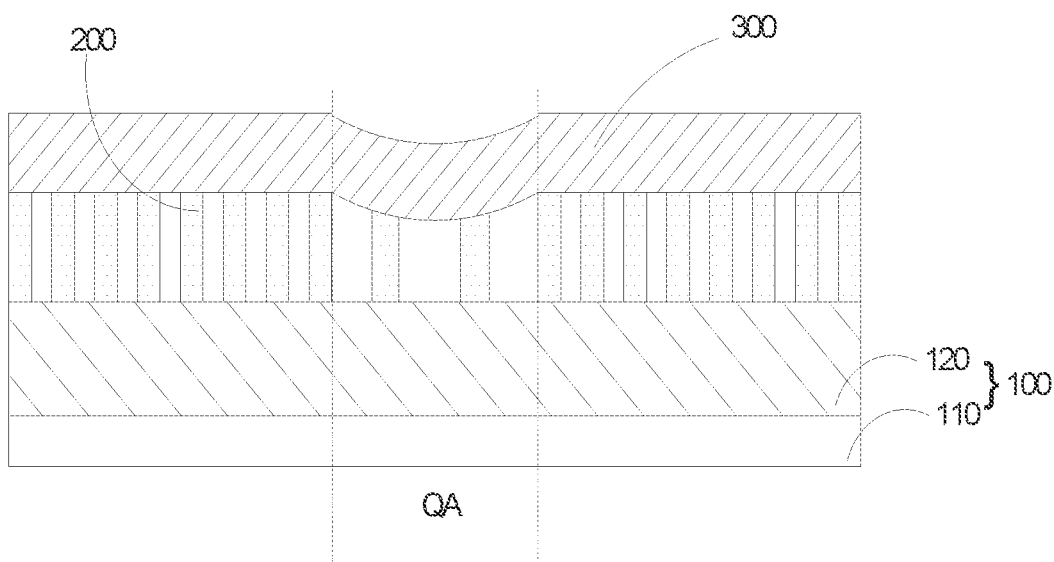
FIG. 9 is a schematic cross-sectional view of a display panel provided by a comparative example.

In order to explain that the display panel provided by the present disclosure can effectively avoid the Newton's ring phenomenon, the following description is made with reference to the comparative embodiment shown in FIG. 9, which is a schematic cross-sectional view of the display panel provided in the comparative embodiment. Due to the unreasonable arrangement of the support columns 200 in FIG. 9, the support strength of the light-transmitting region QA is weaker than the support strength of the adjacent display region AA. The display panel may be a rigid display panel. The display panel includes the display base plate 100, the encapsulation cover plate 300 and the support columns 200 disposed between the display base plate 100 and the encapsulation cover plate 300. Under the action of the gravity of the encapsulation cover plate 300 and the atmospheric pressure, the support columns 200 are inclined to make the downward pressing amount of the support column 200 in the light-transmitting region QA great than the downward pressing amount of the support column 200 in the adjacent display region AA. In the light-transmitting region QA, the encapsulation cover plate 300 is recessed in a direction toward the display base plate 100, such that a microcavity formed by the encapsulation cover plate 300 and the display base plate 100 is changed. When the incident lights reach the surface of the encapsulation cover plate 300, there is a certain optical path difference between the light reflected from the surface of the encapsulation cover plate 300 and the light reflected from the surface of the display base plate 100, and the reflected lights interfere with each other, such that a streak-like Newton's ring phenomenon may occur on the display panel shown in the comparative embodiment.

Figure 11:
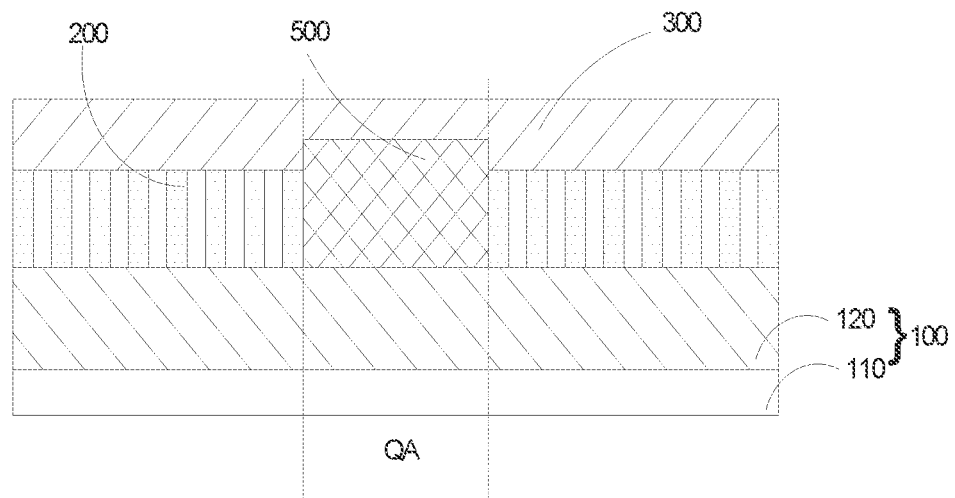
FIG. 11 is a schematic cross-sectional view of the display panel with a light modulation layer according to the present disclosure.

Referring to FIG. 11, the display panel further includes a light modulation layer 500 located in the light-transmitting region QA. The light modulation layer 500 is sandwiched between any adjacent light-transmitting layers covering the light-transmitting region QA. The light modulation layer 500 is configured that at least a part of light modulation layer 500 is capable of improving the light transmittance of light with a preset wavelength between the adjacent light-transmitting layers sandwiching the light modulation layer 500. A refractive index of the light modulation layer 500 is between refractive indices of the adjacent light-transmitting layers sandwiching the light modulation layer 500. By providing the light modulation layer 500, the light transmittance of some wavelengths of lights with lower light transmittance is increased to be close to or even equal to the light transmittance of the other wavelengths of lights with higher light transmittance, so that the uniformity of spectral transmission is improved, and the color fidelity in transmitted lights is improved. In addition, the light modulation layer 500 is capable of supporting the encapsulation cover plate 300 to prevent the encapsulation cover plate 300 from being deformed. Specifically, as shown in FIG. 11, the light modulation layer 500 is sandwiched between the encapsulation cover plate 300 covering the light-transmitting region QA and the display base plate 100, and the refractive index of the light modulation layer 500 is between the refractive index of the encapsulation cover plate 300 and the refractive index of the display base plate 100. The refractive index of the encapsulation cover plate 300 and the refractive index of the display base plate 100 is determined specifically according to the selected materials of the encapsulation cover plate 300 and the display base plate 100.

The refractive index of the light modulation layer 500 satisfies the following formula:

$$n_C = \sqrt{\left(\frac{1-\sqrt{1-\alpha}}{1+\sqrt{1-\alpha}}\right)(n_A \times n_B)} \quad (1)$$

$n_A$ is the refractive index of one of the adjacent light-transmitting layers sandwiching the light modulation layer 500; $n_B$ is the refractive index of the other one of the adjacent light-transmitting layers sandwiching the light modulation layer 500; $n_C$ is the refractive index of the light modulation layer 500; $\alpha$ is the effective rate, and the effective rate $\alpha$ is greater than or equal to 60%. The higher the value of the effective rate $\alpha$, the closer the refractive index $n_C$ of the light modulation layer 500 is to the geometric mean ($\sqrt{n_A \times n_B}$) of the refractive indexes ($n_A$, $n_B$) of the adjacent light-transmitting layers. The effective rate $\alpha$ is greater or equal to 60%, which ensures that the light modulation layer 500 can enhance the light transmittance of light with preset wavelengths between adjacent light-transmitting layers.

Figure 12:
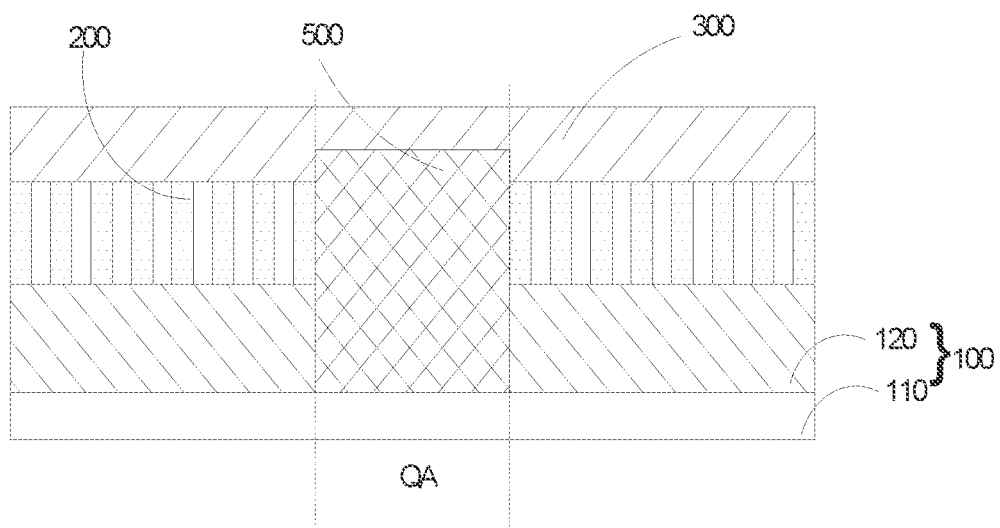
FIG. 12 is a schematic cross-sectional view of the display panel according to the present disclosure illustrating that the light-transmitting region QA is a blind hole structure and the display panel has is provided with a light modulation layer.

Referring to FIG. 12, the light-transmitting region QA includes a blind hole structure, that is, the array device layer 120 includes a structure with through holes. The light modulation layer 500 is arranged between the substrate 110 and the encapsulation cover plate 300, and the refractive index of the light modulation layer 500 is between the refractive index of the substrate 110 and the refractive index of the encapsulation cover plate 300.

Figure 13:
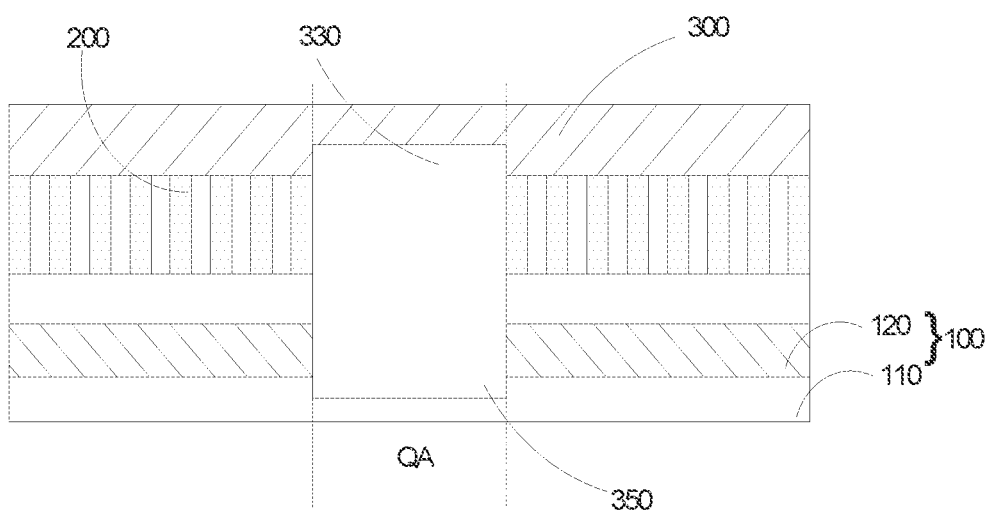
FIG. 13 is a schematic cross-sectional view of the display panel according to the present disclosure in which illustrating that the light-transmitting region QA is a blind hole structure and the display panel is provided with a groove on the substrate.

Referring to FIG. 13, the light-transmitting region QA includes a blind hole structure, that is, the array device layer 120 includes a structure with through holes. In the light-transmitting region QA, the substrate 110 is provided with a fifth groove 350. The depth of the fifth groove 350 is greater than or equal to 10 μm, and less than or equal to 100 μm. An orthographic projection of the fifth groove 350 on the substrate 110 overlaps with an orthographic projection of the third groove 330 on the substrate 110. The third groove 330 and the fifth groove 350 may be provided at the same time, or one of them may be provided independently, as long as the interference condition of light can be destroyed, and the Newton's ring problem in the light-transmitting region QA can be avoided.

The present disclosure further provides a display device, which includes the display panel and the photosensitive assembly according to any one of the aforementioned embodiments. The display panel includes a first surface and a second surface opposite to the first surface. The first surface is a display surface. The photosensitive assembly is located on a side of the display panel where the second surface is located, and the position of the photosensitive assembly corresponds to the position of the light-transmitting region QA. The display device of the present disclosure not only realize full-screen display, but also enable the display panel to have high light transmittance, which is convenient for under-screen integration of device such as the photosensitive assembly.

The photosensitive assembly may be an image acquisition device for acquiring external image information. The photosensitive assembly may be a Complementary Mel Oxide Semiconductor (CMOS) image acquisition device, or a Charge-coupled Device (CCD) image acquisition device, or other forms pf image acquisition devices. The photosensitive assembly may not be limited to an image acquisition device. For example, in some embodiments, the photosensitive assembly may also be a light sensor such as an infrared sensor, a proximity sensor, an infrared lens, a flood light sensing element, an ambient light sensor, a dot matrix projector, and the like. In addition, in the display device, the side of the display panel where the second surface is located may also be integrated with other components, such as an earpiece, a speaker, and the like.

In the display panel and display device according to the present disclosure, the display panel has a display region, a non-display region around the display region, and a transition display region located between the display region and the non-display region. The non-display region may be integrated with a driving circuit, a Flexible Printed Circuit (FPC) and other elements. The display panel includes a display base plate; an encapsulation cover plate located on the display base plate and configured to seal the display base plate; a support column disposed between the display base plate and the encapsulation cover plate, and configured to support the encapsulation cover plate. The support column improves the strength and the pressure resistance of the display region of the display panel, which prevents display defects, such as water ripples, Newton's ring, and the like, from appearing on the display panel. In addition, in the transition display region, the surface of the encapsulation cover plate close to the display base plate is provided with the first groove, and/or the surface of the display base plate close to the encapsulation cover plate is provided with a second groove. In order to prevent the Newton's ring from being generated when the support strength of the support column in the display region is lower than the support strength of the edge encapsulation structure such as the Frit encapsulation structure, the surface of the encapsulation cover plate close to the display base plate in the transition display region is provided with the groove with preset depth, and/or the surface of the display base plate close to the encapsulation cover plate in the transition display region is provided with the groove with preset depth. Since the ordinary light source has the wave train length of several micrometers, the groove provided in the encapsulation cover plate and/or the display base plate can destroy the mutual interference condition of lights at both ends of the bathtub curve, thereby fundamentally avoiding the Newton's ring phenomenon.

The display panel further has a light-transmitting region located in the display region, such that the photosensitive assemblies can be integrated on the back of the light-transmitting display region in the display panel, so as to realize the under-screen integration of the photosensitive assemblies such as cameras, and the like. In the light-transmitting region, the surface of the encapsulation cover plate close to the display base plate is provided with the third groove, and/or the surface of the display base plate close to the encapsulation cover plate is provided with the fourth groove, which destroys the condition of mutual interference of lights on the basis of ensuring the light transmittance of the light-transmitting region, and fundamentally avoids the Newton's ring phenomenon.

The aforementioned embodiments of the present disclosure do not exhaustively describe all the details, nor do they limit the application to only the specific embodiments described. Obviously, many modifications and variations are possible in light of the aforementioned descriptions. These embodiments are selected and described in this specification to better explain the principles and practical applications of the present disclosure, such that those skilled in the art can make good use of the present disclosure and modifications based on the present disclosure. The present disclosure is to be limited only by the claims, along with their full scope and equivalents.

What is claimed is:

1. A display panel comprising a display region, a non-display region around the display region, and a light-transmitting region located in the display region, wherein the display panel comprises:
   a display base plate;
   an encapsulation cover plate, located on the display base plate and configured to seal the display base plate;
   a support column, disposed between the display base plate and the encapsulation cover plate, and configured to support the encapsulation cover plate; and
   wherein the support column further comprises a second annular support column located in the display region close to the light-transmitting region and arranged around the light-transmitting region.

2. The display panel of claim 1, wherein the support column comprises a first annular support column located in the display region close to the transition display region and arranged around the transition display region.

3. The display panel of claim 2, wherein the first annular support column is an annular support column arranged concentrically with a center of the transition display region.

4. The display panel of claim 2, wherein the first annular support column comprises at least two arc-shaped sub-support columns spaced apart from each other.

5. The display panel of claim 1, wherein a depth of the first groove is greater than or equal to 10 µm and less than or equal to 100 µm.

6. The display panel of claim 1, wherein a depth of the second groove is greater than or equal to 10 µm and less than or equal to 100 µm.

7. The display panel of claim 1, further comprising a light-transmitting region located in the display region,
   wherein, in the light-transmitting region, the surface of the encapsulation cover plate close to the display base plate is provided with a third groove.

8. The display panel of claim 1, further comprising a light-transmitting region located in the display region,
   wherein, in the light-transmitting region, the surface of the display base plate close to the encapsulation cover plate is provided with a fourth groove.

9. The display panel of claim 1, further comprising a transition display region located between the display region and the non-display region
   wherein, in the transition display region, a surface of the encapsulation cover plate close to the display base plate is provided with a first groove, and/or a surface of the display base plate close to the encapsulation cover plate is provided with a second groove.

10. The display panel of claim 9, wherein the second annular support column comprises at least two arc-shaped sub-support columns spaced apart from each other.

11. The display panel of claim 7, wherein a depth of the third groove is greater than or equal to 10 μm and less than or equal to 100 μm.

12. The display panel of claim 8, wherein a depth of the fourth groove is greater than or equal to 10 μm and less than or equal to 100 μm.

13. The display panel of claim 1, further comprising a light-transmitting region located in the display region and a light modulation layer located in the light-transmitting region,
wherein the light modulation layer is sandwiched between any adjacent light-transmitting layers covering the light-transmitting region, the light modulation layer is configured that at least a part of the light modulation layer is capable of improving a light transmittance of light with a preset wavelength between the adjacent light-transmitting layers sandwiching the light modulation layer, and a refractive index of the light modulation layer is between refractive indices of the adjacent light-transmitting layers sandwiching the light modulation layer.

14. The display panel of claim 13, wherein the light modulation layer is sandwiched between the encapsulation cover plate covering the light-transmitting region and the display base plate, and the refractive index of the light modulation layer is between the refractive index of the encapsulation cover plate and the refractive index of the display base plate.

15. The display panel of claim 1, wherein a material of the support column comprises at least one of photosensitive siloxane and photosensitive polyimide photoresist.

16. The display panel of claim 1, wherein at least part of the support column is doped with at least one of a rigid bar and a rigid particle.

17. The display panel of claim 13, wherein the light-transmitting region comprises a blind hole structure;
wherein the display base plate comprises a substrate;
wherein the light modulation layer is arranged between the substrate and the encapsulation cover plate;
wherein the refractive index of the light modulation layer is between the refractive index of the substrate and the refractive index of the encapsulation cover plate.

18. The display panel of claim 1, wherein the light-transmitting region comprises a blind hole structure, the display base plate comprises a substrate, and the substrate is provided with a fifth groove.

19. The display panel of claim 18, wherein a depth of the fifth groove is greater than or equal to 10 μm and less than or equal to 100 μm.

20. A display device, comprising:
a display panel of claim 1; and
a photosensitive assembly disposed corresponding to the light-transmitting region of the display panel;
wherein the display panel comprises a first surface and a second surface opposite to the first surface;
wherein the first surface is a display surface; and
wherein the photosensitive assembly is located on a side of the display panel where the second surface is located.

21. A display panel comprising a display region, a non-display region around the display region, and a light-transmitting region located in the display region, and a light modulation layer located in the light-transmitting region, wherein the display panel comprises:
a display base plate;
an encapsulation cover plate, located on the display base plate and configured to seal the display base plate;
a support column, disposed between the display base plate and the encapsulation cover plate, and configured to support the encapsulation cover plate; and
wherein the light-transmitting region comprises a blind hole structure, the display base plate comprises a substrate; and the light modulation layer is arranged between the substrate and the encapsulation cover plate.

22. The display panel of claim 21, further comprising a transition display region located between the display region and the non-display region,
wherein, in the transition display region, a surface of the encapsulation cover plate close to the display base plate is provided with a first groove, and/or a surface of the display base plate close to the encapsulation cover plate is provided with a second groove.

23. The display panel of claim 22, wherein the light modulation layer is sandwiched between any adjacent light-transmitting layers covering the light-transmitting region, the light modulation layer is configured that at least a part of the light modulation layer is capable of improving a light transmittance of light with a preset wavelength between the adjacent light-transmitting layers sandwiching the light modulation layer, and a refractive index of the light modulation layer is between refractive indices of the adjacent light-transmitting layers sandwiching the light modulation layer.

24. The display panel of claim 23, wherein the refractive index of the light modulation layer is between the refractive index of the substrate and the refractive index of the encapsulation cover plate.

* * * * *